(12) United States Patent
Saito

(10) Patent No.: US 6,787,454 B1
(45) Date of Patent: Sep. 7, 2004

(54) METHOD OF MANUFACTURING SEMICONDUCTOR DEVICE HAVING DUAL DAMASCENE STRUCTURE

(75) Inventor: Takayuki Saito, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/683,392

(22) Filed: Oct. 14, 2003

(30) Foreign Application Priority Data

Feb. 20, 2003 (JP) ........................................ 2003-043303

(51) Int. Cl.[7] ........................................ H01L 21/4763
(52) U.S. Cl. ...................... 438/637; 438/638; 438/700; 438/701; 438/702
(58) Field of Search ................................ 438/637–638, 438/700–702

(56) References Cited

U.S. PATENT DOCUMENTS

| 5,091,339 A | * | 2/1992 | Carey ........................... 216/18 |
| 5,173,442 A | * | 12/1992 | Carey ........................... 216/18 |
| 5,219,787 A | * | 6/1993 | Carey et al. ................. 438/637 |
| 6,607,654 B2 | * | 8/2003 | Lee et al. ..................... 205/296 |
| 2002/0036144 A1 | * | 3/2002 | Lee et al. ..................... 205/296 |
| 2003/0116439 A1 | * | 6/2003 | Seo et al. ..................... 205/125 |
| 2004/0007325 A1 | * | 1/2004 | Pan et al. ................... 156/345.1 |

FOREIGN PATENT DOCUMENTS

JP    2002-203898    7/2002

* cited by examiner

Primary Examiner—Lynne Gurley
(74) Attorney, Agent, or Firm—Leydig, Voit & Mayer, Ltd.

(57) ABSTRACT

A via hole is formed to reach a Cu interconnection through an interlayer insulating film that covers the Cu interconnection. A conductive polymeric member is buried in the via hole electrolytically. A resist pattern is formed on the interlayer insulating film by photolithography, and a trench is formed, connected to the via hole, by etching, using the resist pattern as a mask. The resist pattern and the conductive polymeric member are removed thereafter.

6 Claims, 6 Drawing Sheets

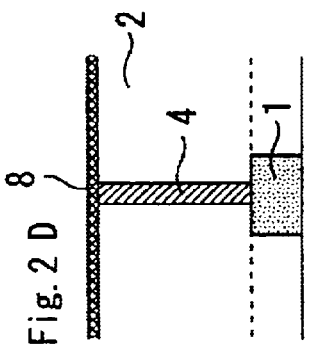
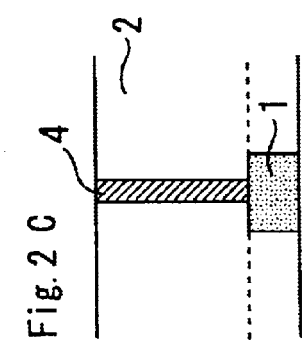
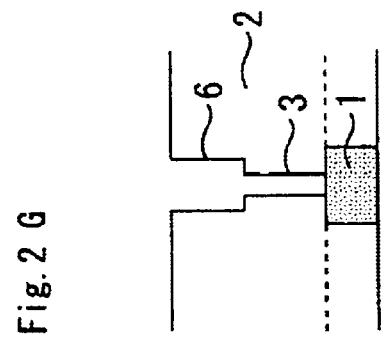
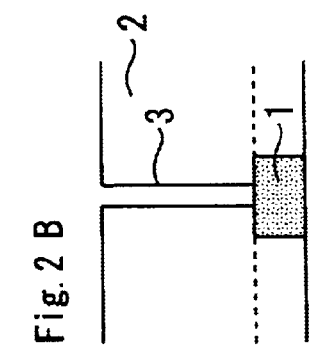
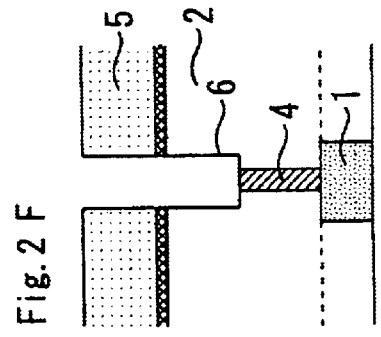
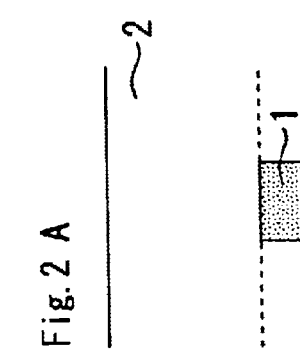
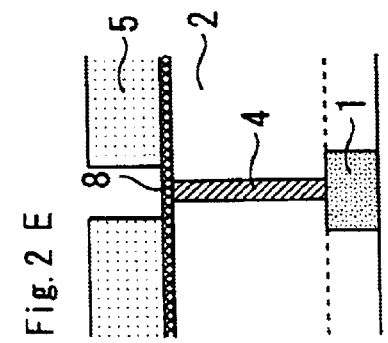

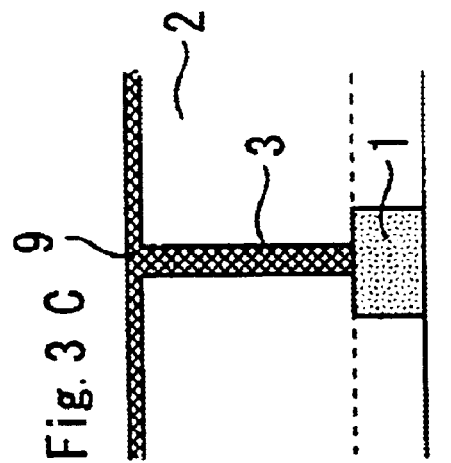
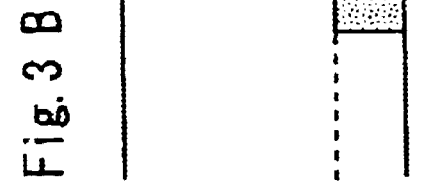
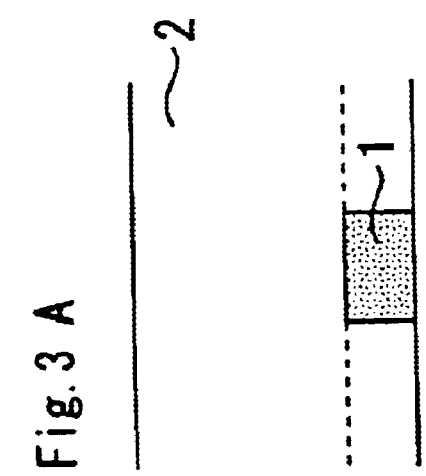
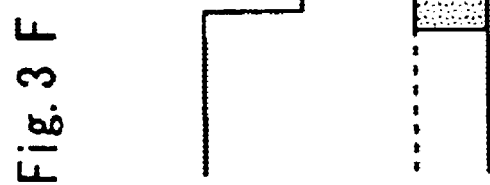
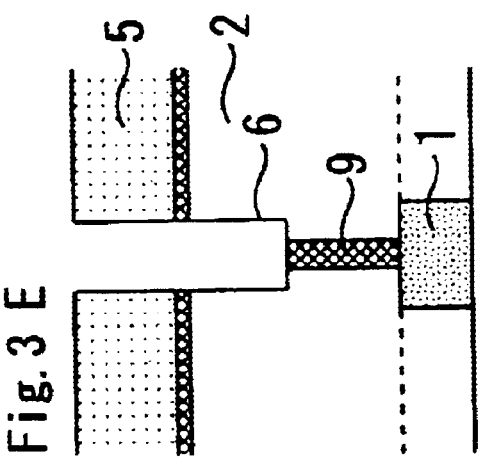
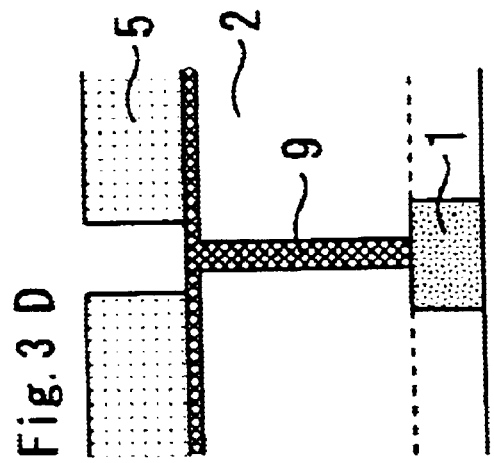

METHOD OF MANUFACTURING SEMICONDUCTOR DEVICE HAVING DUAL DAMASCENE STRUCTURE

BACKGROUND OF THE INVENTION

1. Field of the Invention

The present invention relates to a method of manufacturing a semiconductor device and, in particular, to a method of forming a dual damascene structure.

2. Description of the Background Art

In recent years, wiring structures of semiconductor devices have come to be formed by a dual damascene process in which a via hole (connection hole) and a trench (wiring trench) are formed integrally. As described in Japanese Patent Laid-Open No. 2002-203898, for example, a via-first method in which the via hole is formed before the trench has an advantage over a trench-first method that a sufficient opening margin is secured even if the trench is deviated from the via hole.

However, in the via-first method, to prevent a Cu interconnection from being damaged by trench formation etching, it is necessary to fill in the via hole with a filler material such as a resist or an organic ARC (anti-reflective coating) or the like in the following manner.

FIGS. 5A to 5G are sectional views showing a conventional method of manufacturing a semiconductor device.

First, as shown in FIG. 5A, an interlayer insulating film 2 is formed so as to cover a Cu interconnection 1. Then, as shown in FIG. 5B, a via hole 3 is formed through the interlayer insulating film 2 by photolithography and etching. Then, as shown in FIG. 5C, a filler member 21 is formed on the interlayer insulating film 2 including inside the via hole 3 by spin coating or the like.

Subsequently, the filler member 21 is etched back as shown in FIG. 5D. A resist pattern 22 is thereafter formed on the interlayer insulating film 2 as shown in FIG. 5E. Then, as shown in FIG. 5F, a trench 23 is formed by etching by using the resist pattern 22 as a mask.

Then, the resist pattern 22 and the filler member 21 are removed as shown in FIG. 5G. Thereafter, a wiring material such as Cu or the like is buried in the trench 23 and the via hole 3 to form a wiring structure.

In the above conventional method in which the filler member 21 is formed by spin coating, the filler member 21 needs to be etched back.

However, it is difficult to accurately control a thickness of the filler member 21 in an etch-back step, raising a problem that a height of the filler member 21 varies within the substrate and a height of the trench formation resist 22 varies accordingly as shown in FIG. 6A.

If photolithography is performed in such a state, differences occur between opening widths A of the resist pattern 22 as shown in FIG. 6B, as a result of which a dimension of a trench interconnection varies.

SUMMARY OF THE INVENTION

The present invention has been conceived to solve the previously-mentioned problems and a general object of the present invention is to provide a novel and useful method of manufacturing a semiconductor device.

A more specific object of the present invention is to increase a controllability of a dimension of a trench formation resist pattern.

The above object of the present invention is attained by a following method of manufacturing a semiconductor device.

According to an aspect of the present invention, in the method, a via hole, which reaches an underlying interconnection through an interlayer insulating film that covers the underlying interconnection, is first formed. Next, a conductive polymeric member is formed in the via hole by electrolysis. Then, a resist pattern is formed on the interlayer insulating film. Finally, a trench connected to the via hole is formed by etching by using the resist pattern as a mask.

Other objects and further features of the present invention will be apparent from the following detailed description when read in conjunction with the accompanying drawings.

BRIEF DESCRIPTION OF THE DRAWINGS

FIGS. 2A to 2G are sectional views showing a process of a modification of the first embodiment FIGS. 3A to 3F are process sectional views showing a method of manufacturing a semiconductor device according to a second embodiment of the invention;

DETAILED DESCRIPTION OF THE PREFERRED EMBODIMENTS

Figure 1A:
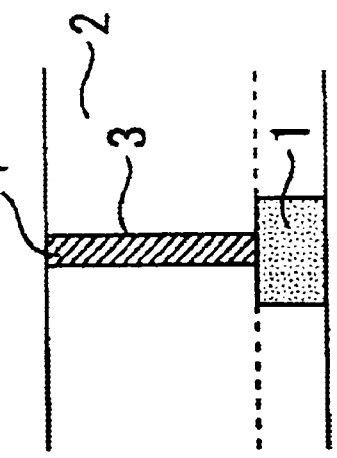
FIGS. 1A to 1F are process sectional views showing a method of manufacturing a semiconductor device according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIGS. 1A to 1F are process sectional views showing a method of manufacturing a semiconductor device according to a first embodiment of the present invention. More specifically, FIGS. 1A to 1F illustrate a method of forming a dual damascene structure by a via-first method.

First, as shown in FIG. 1A, a Cu interconnection as an underlying interconnection (lower-layer interconnection) is formed on a substrate (not shown) and an interlayer insulating film 2 is formed above the entire substrate so as to cover the Cu interconnection 1.

Figure 1B:
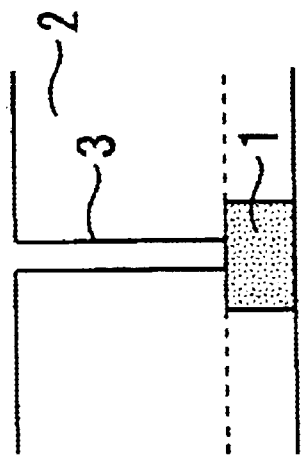

Then, as shown in FIG. 1B, after a resist pattern (not shown) is formed on the interlayer insulating film 2 by photolithography, a via hole 3 is formed through the interlayer insulating film 2 so as to reach the top surface of the Cu interconnection 1 by etching by using the resist pattern as a mask. The resist pattern is removed thereafter.

Figure 1C:
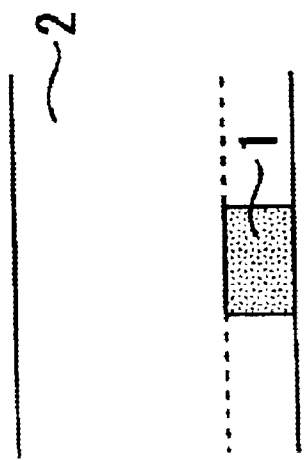

Subsequently, as shown in FIG. 1C, a conductive polymeric member 4 is formed only in the via hole 3 by electrolysis. The burying of the conductive polymeric member 4 is stopped at a top surface of the interlayer insulating film 2 by adjusting the time of the electrolysis. For example, the conductive polymeric member 4 is made of a conductive polymer such as an aniline, pyrrole, orthiophene polymer. The pyrrole polymer is formed by electrolyzing a pyrrole monomer of 0.14 mol/l and a p-toluenesulfonate of 0.05 mol/l in a propylene carbonate solution as an electrolyte.

Figure 1D:
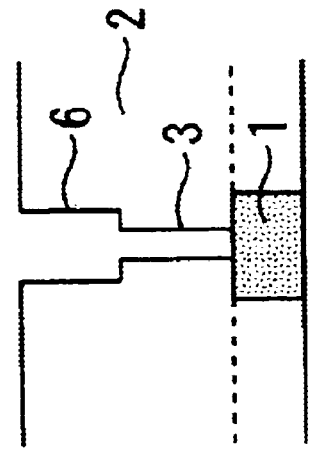

Then, as shown in FIG. 1D, a trench formation resist pattern 5 is formed on the interlayer insulating film 2 by photolithography. At this time, contrary to the conventional case, it is not necessary to etch back the conductive polymeric member 4 because the top surface of the conductive polymeric member 4 is flush with that of the interlayer insulating film 2, that is, a number of conductive polymeric members 4 have the same height within the substrate. Therefore, this manufacturing method is free of the problems that the resist film thickness varies due to difficulty in controlling the height of the conductivity polymeric member 4 and that the dimension of the resist pattern 5 varies.

Figure 1E:
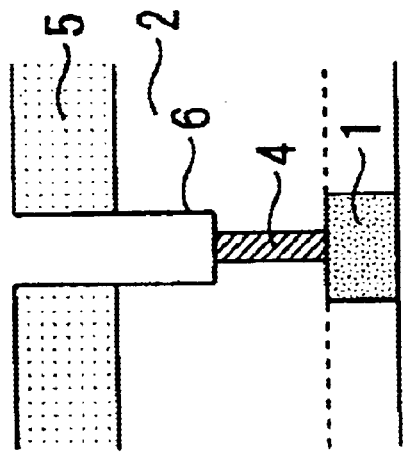

Then, as shown in FIG. 1E, a trench 6 for an upper-layer interconnection is formed by etching the interlayer insulating film 2 and the conductive polymeric member 4 by using the resist pattern 5 as a mask.

Figure 1F:
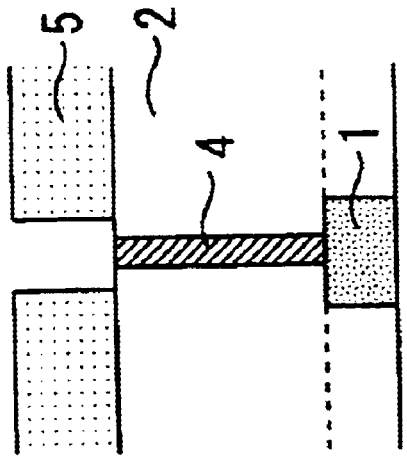

Then, the resist pattern 5 and the conductive polymeric member 4 are removed as shown in FIG. 1F. Thereafter, a wiring material such as Cu or the like is buried in the trench 6 and the via hole 3, whereby a dual damascene structure is completed.

As described above, in the first embodiment, after a via hole 3 has been formed a conductive polymeric member 4 is buried in the via hole 3 by electrolysis. Since the conductive polymeric member 4 is formed only in the via hole 3, that is, it is not formed on the interlayer insulating film 2, it is not necessary to etch back the filler member like in the conventional case. Therefore, the number of manufacturing steps can be reduced and the manufacturing cost of a semiconductor device can be made lower than in the conventional case.

Since it is not necessary to control the etch-back amount of the conductive polymeric member 4, the dimensional variation of the trench formation resist pattern 5 due to non-uniformity in the etch-back amount can be reduced. That is, the controllability of the dimension of the trench formation resist pattern 5 is increased. The present inventor has found that it has become possible to reduce the dimensional variation of the line of a 0.14-$\mu$m line/space pattern from 0.14 ±0.02 $\mu$m to 0.14 ±0.01 $\mu$m. Using the resist pattern 5 that is formed with such superior dimension controllability makes it possible to form, with high accuracy, the trench 6 and hence a dual damascene structure.

In the first embodiment, the conductive polymeric member 4 is buried in the via hole 3 in such a manner that the top surface of the conductive polymeric member 4 is flush with that of the interlayer insulating film 2. However, the position of the top surface of the conductive polymeric member 4 (i.e., the height of the conductive polymeric member 4) can easily be controlled by controlling the conditions, such as the time or the like, of the electrolysis.

It is also possible to lower a height of the conductive polymeric member 4 buried in the via hole 3 by etching back the conductive polymeric member 4 formed by the electrolysis.

A modification of the first embodiment will be described below. FIGS. 2A to 2G are sectional views showing a process of a modification of the first embodiment.

This modification is basically the same as the first embodiment and is different from it in the following. In this modification, after a conductive polymeric member 4 is formed in a via hole 3 by electrolysis as shown in FIG. 2C, an organic ARC (anti-reflective coating) 8 is formed on an interlayer insulating film 2 and the conductive polymeric member 4 as shown in FIG. 2D. Then, a trench formation resist pattern 5 is formed on the organic ARC as shown in FIG. 2E. At this time, the organic ARC 8 can be used as an anti-reflective coating when the resist pattern 5 is formed by photolithography. Therefore, the controllability of the dimension of the resist pattern 5 can be improved and hence the trench 6 can be formed with higher accuracy than even in the first embodiment.

Second Embodiment

FIGS. 3A to 3F are process sectional views showing a method of manufacturing a semiconductor device according to a second embodiment of the invention.

First, similarly as in the case of the first embodiment, an interlayer insulating film 2 is formed so as to cover the Cu interconnection 1 and a via hole 3 is formed through the interlayer insulating film 2 (see FIGS. 3A and 3B).

Then, as shown in FIG. 3C, a conductive polymeric member 9 having a function of an anti-reflective coating is formed in the via hole 3 and on the interlayer insulating film 2 by electrolysis. The conductive polymeric member 9 is made of a material that absorbs KrF excimer laser light, such as an anthracene derivative.

Subsequently, as shown in FIG. 3D, a resist pattern 5 is formed on the conductive polymeric member 9 by photolithography by using a KrF excimer laser, for example, as a light source. During the photolithography, the conductive polymeric member 9 which functions as an anti-reflective film exists under the resist pattern 5, the controllability of the dimension of the resist pattern 5 is improved. Since the conductive polymeric member 9 is superior in flatness because it was formed by the electrolysis, it need not be etched back unlike in the conventional case.

Then, as shown in FIG. 3E, a trench 6 for an upper-layer interconnection is formed by etching the interlayer insulating film 2 and the conductive polymeric member 9 by using the resist pattern 5 as a mask.

Then, as shown in FIG. 3F, the resist pattern 5 and the conductive polymeric member 9 are removed. Thereafter, a wiring material such as Cu or the like is buried in the trench 6 and the via hole 3, whereby a dual damascene structure is completed.

As described above, in the second embodiment, the conductive polymeric member 9 is formed in the via hole 3 and on the interlayer insulating film 2 by controlling the electrolysis time or the like and the conductive polymeric member 9 is given the function of an anti-reflective coating. Thereby, the conductive polymeric member 9 can be used as an anti-reflective coating when the trench formation resist pattern 5 is formed. This increases the controllability of the dimension of the resist pattern 5. Further, since it is not necessary to etch back the filler member unlike in the conventional case, the number of manufacturing steps can be reduced and the manufacturing cost of a semiconductor device can be lowered.

Third Embodiment

FIGS. 4A to 4E are process sectional views showing a method of manufacturing a semiconductor device according to a third embodiment of the invention.

Figure 4:
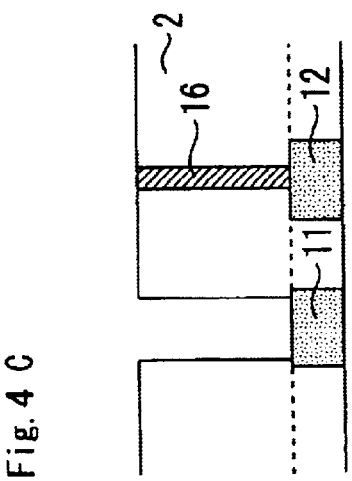
FIGS. 4A to 4E are process sectional views showing a method of manufacturing a semiconductor device according to a third embodiment of the invention.
Figure 4:
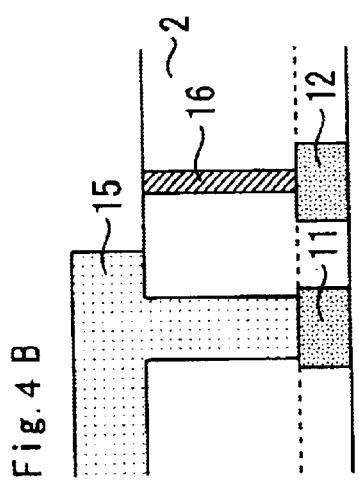
Figure 4:
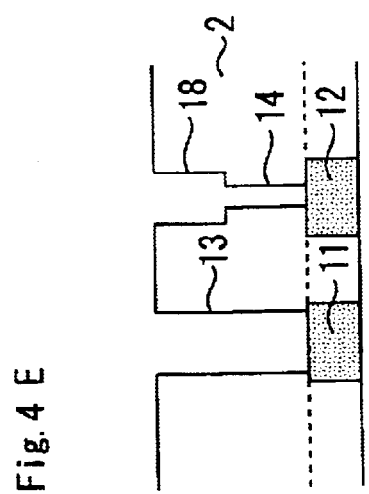
Figure 4:
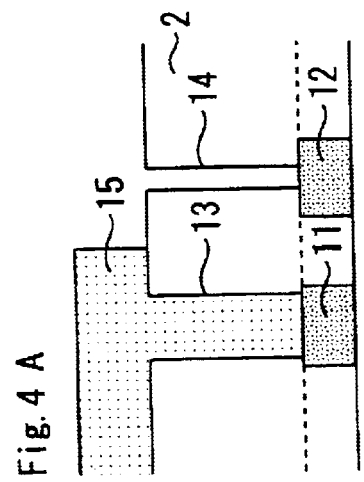
Figure 4:
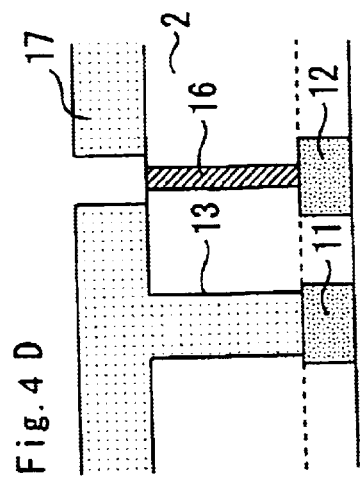
Figure 5:
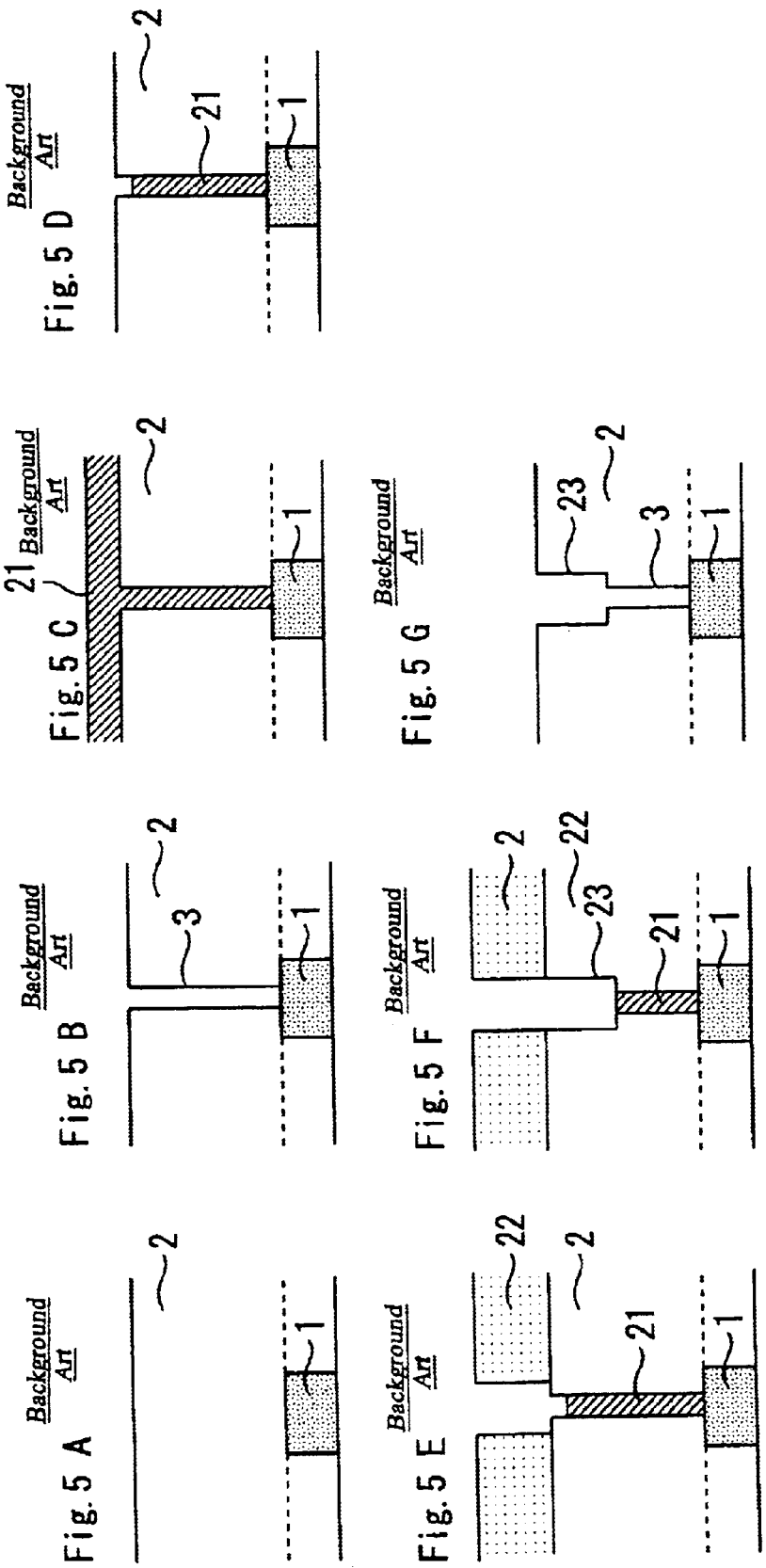
FIGS. 5A to 5G are sectional views showing a conventional method of manufacturing a semiconductor device.
Figure 6:
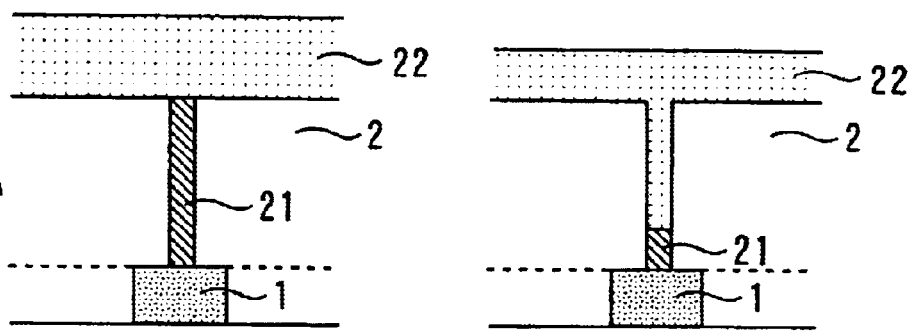
FIGS. 6A and 6B are sectional views showing a change in dimension of a resist pattern in the conventional manufacturing method.
Figure 6:
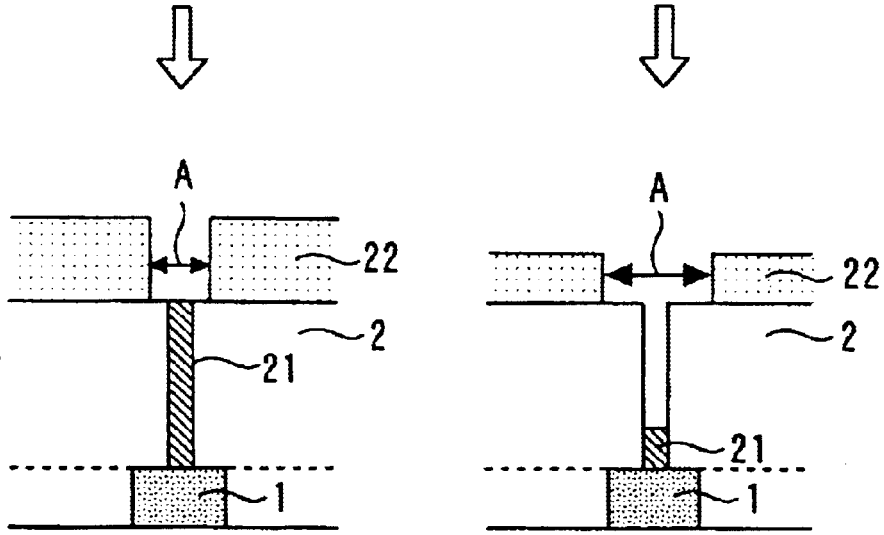

First, as shown in FIG. 4A, a plurality of Cu interconnections 11 and 12 are formed on a substrate and an interlayer insulating film 2 is formed above the entire substrate so as to cover the Cu interconnections 11 and 12. Then, via holes 13 and 14 are formed through the interlayer insulating film 2 by photolithography and etching so as to reach the respective Cu interconnections 11 and 12. Then, a resist pattern is formed as a mask 15 that covers a region including inside of the via hole 13 where a dual damascene structure will not be formed and that does not cover a region where to form the dual damascene structure.

Then, as shown in FIG. 4B, a conductive polymeric member 16 is formed by electrolysis only in the via hole 14 which is not covered with the resist film 15.

Subsequently, as shown in FIG. 4C, the resist pattern 15 is removed by using an organic solvent. Since the conductive polymeric member 16 is insoluble in the organic solvent, only the resist pattern 15 is removed selectively.

Then, as shown in FIG. 4D, a trench formation resist pattern 17 is formed on the interlayer insulating film 2 including inside the via hole 13 by photolithography.

Then, as shown in FIG. 4E, a trench 18 for an upper-layer interconnection is formed by etching the interlayer insulating film 2 and the conductive polymeric member 16 using the resist pattern 17 as a mask. Then, the resist pattern 17 and the conductive polymeric member 16 are removed. Thereafter, a wiring material such as Cu is buried in the via hole 13, the trench 18, and the via hole 14, whereby wiring structures are completed.

As described above, in the third embodiment, after the via hole 13 for which a trench will not be formed of the plurality of via holes 13 and 14 is covered with the resist pattern 15, the conductive polymeric member 16 is formed by electrolysis in the via hole 14 which is not covered with the resist pattern 15. In this manner, a conductive polymeric member can be buried selectively by using a mask in a via hole that needs to be filled with a filler member among a plurality of via holes.

Although the third embodiment is directed to the case that two via holes are formed, three or more via holes may be formed.

This invention, when practiced illustratively in the manner described above, provides the following major effects:

According to the invention, the controllability of the dimension of a trench formation resist pattern can be improved.

Further, the present invention is not limited to these embodiments, but variations and modifications may be made without departing from the scope of the present invention.

The entire disclosure of Japanese Patent Application No. 2003-043303 filed on Feb. 20, 2003 containing specification, claims, drawings and summary are incorporated herein by reference in its entirety.

What is claimed is:

1. A method of manufacturing a semiconductor device having a dual damascene structure, comprising:

forming a via hole which reaches an underlying interconnection through an interlayer insulating film that covers the underlying interconnection;

forming a conductive polymeric member in the via hole electrolytically;

forming a resist pattern on the interlayer insulating film after forming the conductive polymeric member; and forming a trench connected to the via hole by etching the interlayer insulating film using the resist pattern as a mask.

2. The method according to claim 1, wherein the conductive polymeric member is selected from the group consisting of an aniline polymer, a pyrrole polymer, and a thiophene polymer.

3. The method according to claim 1, including forming the conductive polymeric member on the interlayer insulating film so the conductive polymeric member absorbs exposure light used in forming the resist pattern.

4. The method according to claim 3, including producing the exposure light with a KrF excimer laser, wherein the conductive polymeric member contains an anthracene derivative.

5. The method according to claim 1, further comprising forming an anti-reflective film on the interlayer insulating film and the conductive polymeric member after forming the conductive polymeric member, and forming the resist pattern on the anti-reflective film.

6. The method according to claim 1, including forming a plurality of via holes when forming a via hole, and masking, before forming the conductive polymeric member, a via hole in which the conductive polymeric member is not to be formed.

* * * * *